United States Patent [19]

Kondou

[11] Patent Number: 5,065,367
[45] Date of Patent: Nov. 12, 1991

[54] HIGH-GAIN SENSE AMPLIFIERS ARRAY FOR HIGH-SPEED READ OPERATION

[75] Inventor: Kenji Kondou, Tokyo, Japan
[73] Assignee: NEC Corporation, Tokyo, Japan
[21] Appl. No.: 505,390
[22] Filed: Apr. 6, 1990
[30] Foreign Application Priority Data Apr. 6, 1989 [JP] Japan .................................. 1-88932

[51] Int. Cl.$^5$ ................................................ G11C 7/00
[52] U.S. Cl. .................................. 365/208; 365/190
[58] Field of Search ............... 365/190, 202, 205, 207, 365/208

[56] References Cited

U.S. PATENT DOCUMENTS 4,504,748 3/1985 Oritani ................................. 365/205

Primary Examiner—Joseph A. Popek
Attorney, Agent, or Firm—Sughrue, Mion, Zinn, Macpeak & Seas

[57] ABSTRACT

In an array of sense amplifiers associated respectively columns of a matrix array of memory cells, each amplifier comprises a first transistor having a source-drain current path connected at one end to a first output terminal and a gate connected to first ends of the memory cells of the associated column, a second transistor having a source-drain current path connected at one end to a second output terminal and a gate connected to second ends of the memory cells of the associated column. A third transistor is provided in each amplifier for grounding the other ends of the source-drain current paths of the first and second transistors when the associated column is identified by a column address during a read cycle to cause them to respond to complementary voltages supplied from a memory cell of the associated column. Fourth and fifth transistors are provided for grounding the gate electrodes of the first and second transistors when the associated column is not identified by the column address signal during the read cycle to prevent the first and second transistors from responding to voltages supplied from a memory cell of the associated column.

9 Claims, 4 Drawing Sheets

HIGH-GAIN SENSE AMPLIFIERS ARRAY FOR HIGH-SPEED READ OPERATION

BACKGROUND OF THE INVENTION

This invention relates generally to semiconductor memories, and more particularly to an array of sense amplifiers for reading data from memory cells.

In semiconductor memories, memory cells are arranged in a matrix of rows and columns and each cell is identified by a set of row and column addresses during a write mode. During a read mode, on the other hand, memory cells of a row are simultaneously accessed by a row address and stored data are supplied from the cells of the addressed row to associated sense amplifiers. One of the sense amplifiers is enabled by a column address to select one of the supplied data for differential amplification. Each of the sense amplifiers comprises first and second transistors whose source electrodes are coupled to output terminals to which a voltage source is also connected through load transistors. A third transistor is further provided in each sense amplifier for grounding the drain electrodes of the first and second transistor when the sense amplifier is selected by the column address. However, since nonselected sense amplifiers are also supplied with voltages from the memory cells, the first and second transistors of the nonselected amplifiers also respond to these voltages in such a manner that a low-impedance path is created across the output terminals through which a leakage current flows. As a result of this leakage, a satisfactory differential amplification gain cannot be obtained for a selected sense amplifier. To avoid this problem, one prior art sense amplifier includes fourth and fifth transistors which are connected respectively in series with the source electrodes of the first and second transistors to prevent them from responding to the voltages from the memory cells when the sense amplifier is not selected. However, one disadvantage of this approach is the introduction of a signal propagation delay.

SUMMARY OF THE INVENTION

It is therefore an object of the present invention to provide an array of high-gain sense amplifiers for reading data at high speed from a matrix array of memory cells.

According to the present invention, there is provided an amplifier circuit for a matrix array of memory cells. Each of the memory cells stores energy when the row and column of the cell are accessed by a set of a row address signal and a column address signal during a write cycle, and each of the memory cells of each row generates complementary voltages when the row is accessed in response to the row address signal during a read cycle. The amplifier circuit comprises a voltage supply coupled to first and second output terminals, an array of sense amplifiers associated respectively with columns of the memory cells. Each sense amplifier comprises a first transistor having a source-drain current path connected at one end thereof to the first output terminal and a gate electrode connected to first ends of the memory cells of the associated column, a second transistor having a source-drain current path connected at one end thereof to the second output terminal and a gate electrode connected to second, opposite ends of the memory cells of the associated column, and a third transistor for grounding the other ends of the source-drain current paths of the first and second transistors when the associated column is identified by the column address signal during the read cycle to cause the first and second transistors to respond to complementary voltages supplied from one of the memory cells of the associated column. Fourth and fifth transistors are provided for grounding the gate electrodes of the first and second transistors when the associated column is not identified by the column address signal during the read cycle to prevent the first and second transistors from responding to voltages supplied from one of the memory cells of the associated column. Since the gates of the first and second transistors are grounded when the sense amplifier is not selected by the column address signal, they are prevented from responding to voltages from the cells of an accessed row. High differential amplification gain can therefore be obtained without introducing propagation delays.

BRIEF DESCRIPTION OF THE DRAWINGS

The present invention will be described in further detail with reference to the accompanying drawings, in which.

DETAILED DESCRIPTION

Figure 1:
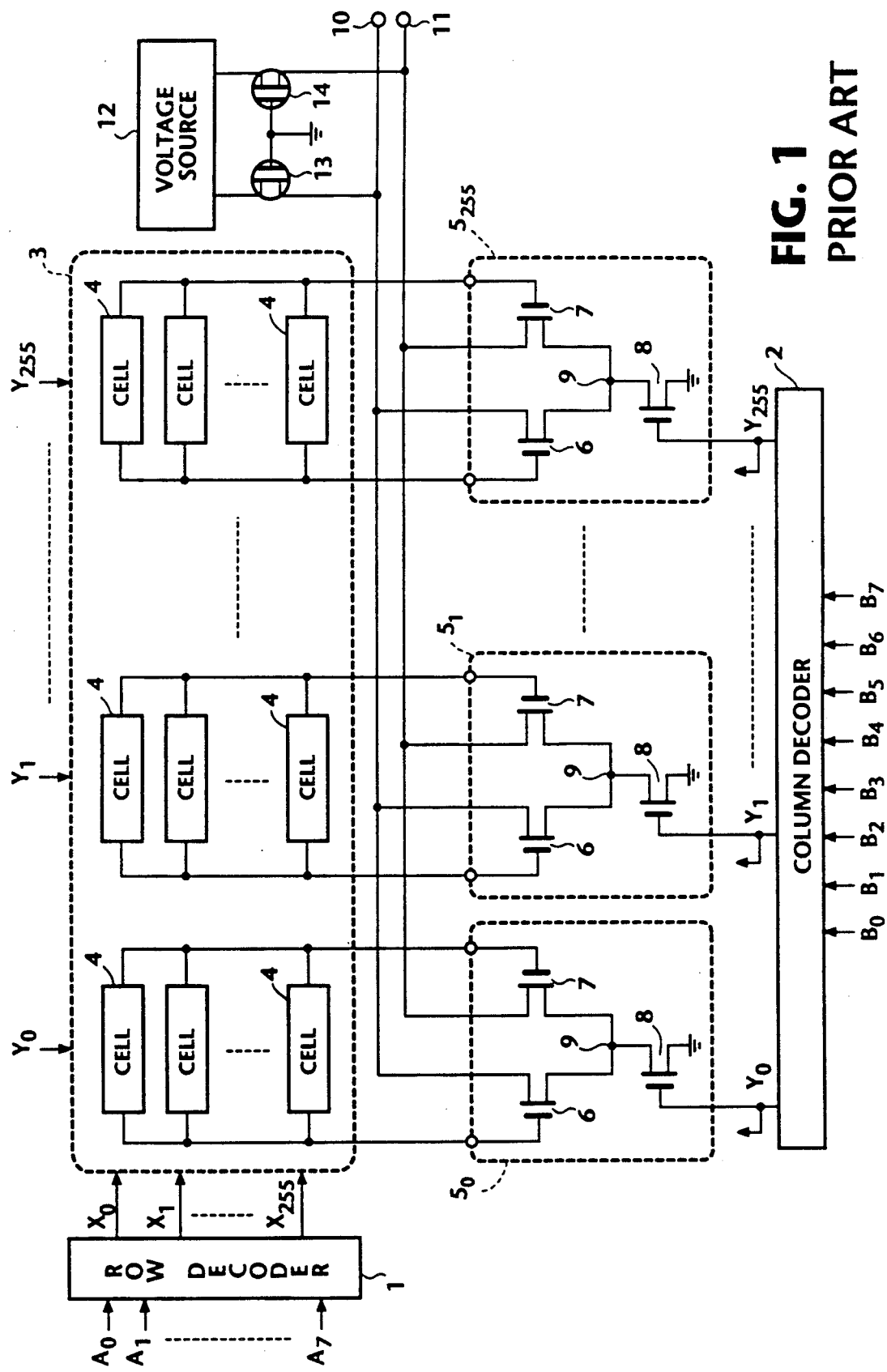
FIG. 1 is a circuit diagram of an array of prior art sense amplifiers for reading signals from a matrix array of memory cells.
Figure 2:
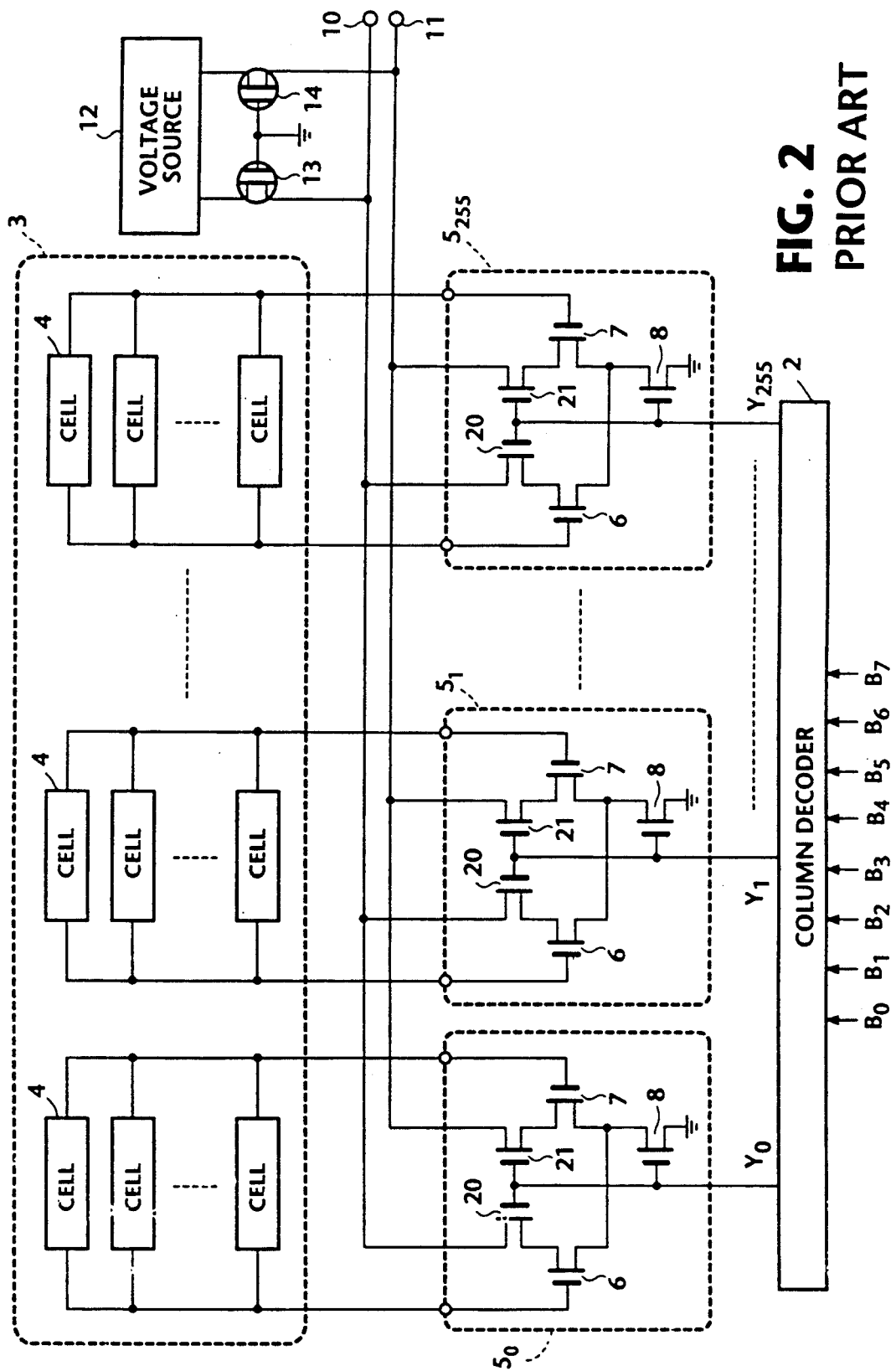
FIG. 2 is a circuit diagram of an array of another prior art sense amplifiers.

Before going into details of the present invention, it is appropriate to describe prior art sense amplifiers with reference to FIGS. 1 and 2. In FIG. 1, sense amplifiers $5_0$ to $5_{255}$ are associated respectively with corresponding columns of an array of cells 4 which are arranged in a matrix of 256 rows and 256 columns and which form an essential part of a (256×256) memory 3 (such as random access memory) which additionally includes a write circuit and a read circuit, not shown. Row selecting signals $X_0$ to $X_{255}$ and column selecting signal $Y_0$ to $Y_{255}$ are supplied to memory 3 from a row decoder 1 and a column decoder 2 to which 8-bit code ($A_0$ to $A_7$) and 8-bit code ($B_0$ to $B_7$) are applied, respectively. The write circuit of the memory 3 responds to a particular set of X and Y signals to identify each one of the memory cells and the read circuit of the memory 3 responds to an X signal to identify the memory cells of a particular row to simultaneously read data out of these memory cells into the sense amplifiers 5 to which Y signals are respectively supplied from column decoder 2.

Each sense amplifier 5 is made up of a pair of n-type MOS transistors 6 and 7, the gate electrodes of the transistors being coupled to the opposite ends of memory cells 4 of a corresponding column. The source electrodes of transistors 6 and 7 are connected respectively to memory output terminals 10 and 11, their drain electrodes being coupled together to a circuit junction 9 which is grounded through an n-type MOS transistor 8 which acts as a switching element. The transistor 8 of each sense amplifier has its gate coupled to an output terminal of column decoder 2 which corresponds to the sense amplifier to conduct transistors 6 and 7 in response to a decoder output. Transistors 6 and 7 form a differential amplifier to sense a set of complementary voltages developed across a cell of the corresponding column of the matrix array when it is addressed in a read cycle by the row decoder 1. The turn-on of transistor 6 or 7 causes currents to be supplied from a voltage source 12 via p-type MOS transistors 13 and 14 to output terminals 10 and 11, developing an amplified differential voltage thereacross.

In response to a high-level input from terminal $Y_0$, amplifier $5_0$ is selected and transistor 8 of this amplifier is turned on, coupling the drain electrodes of transistors 6 and 7 of the amplifier to ground. Application of high and low complementary voltages to the gates of transistors 6 and 7, respectively, of the selected amplifier will then cause the transistor 6 to turn on, reducing the potential at the circuit junction 9. This lowers the channel conductance of transistor 6 to a level below that of transistor 7, so that low and high voltages respectively appear at output terminals 10 and 11. Under these conditions, if a voltage should appear at the gate of transistor 6 of a nonselected sense amplifier and the difference between this gate voltage and the low output voltage at terminal 10 exceeds a certain threshold, the transistor 6 of the nonselected amplifier will turn on, reducing the potential at junction 9. This results in a rise in voltage across the junction 9 and the gate of transistor 7 of the nonselected amplifier to a level sufficient to conduct transistor 7. The conducting transistors 6 and 7 of the nonselected amplifier establish a low impedance path across terminals 10 and 11, causing a leakage current to flow through transistors 6 and 7 reducing the voltage difference across terminals 10 and 11. This imposes limitations on the amplification gain of the selected sense amplifier $5_0$, since it is given by the ratio of the voltage difference across terminals 10 and 11 to the voltage difference across the gates of transistors 6 and 7 of amplifier $5_0$.

Another sense amplifiers array shown in FIG. 2 eliminates such leakage currents by the provision of n-type MOS transistors 20 and 21 whose source-drain current paths are connected in series between transistors 6 and 7 to transistors 13 and 14 in order to isolate nonselected sense amplifiers from output terminals 10 and 11. However, transistors 6 and 7 must be capable of driving output terminals 10 and 11 by way of isolating transistors 20 and 21. This implies that transistors 6, 7, 20 and 21 must be of a large-current ratings. In particular, the use of large-current type for the isolating transistors 20 and 21 introduces extra capacitances to the conductors to output terminals 10 and 11. Therefore, the increase in the capacitances will cause data propagation delays.

Figure 3:
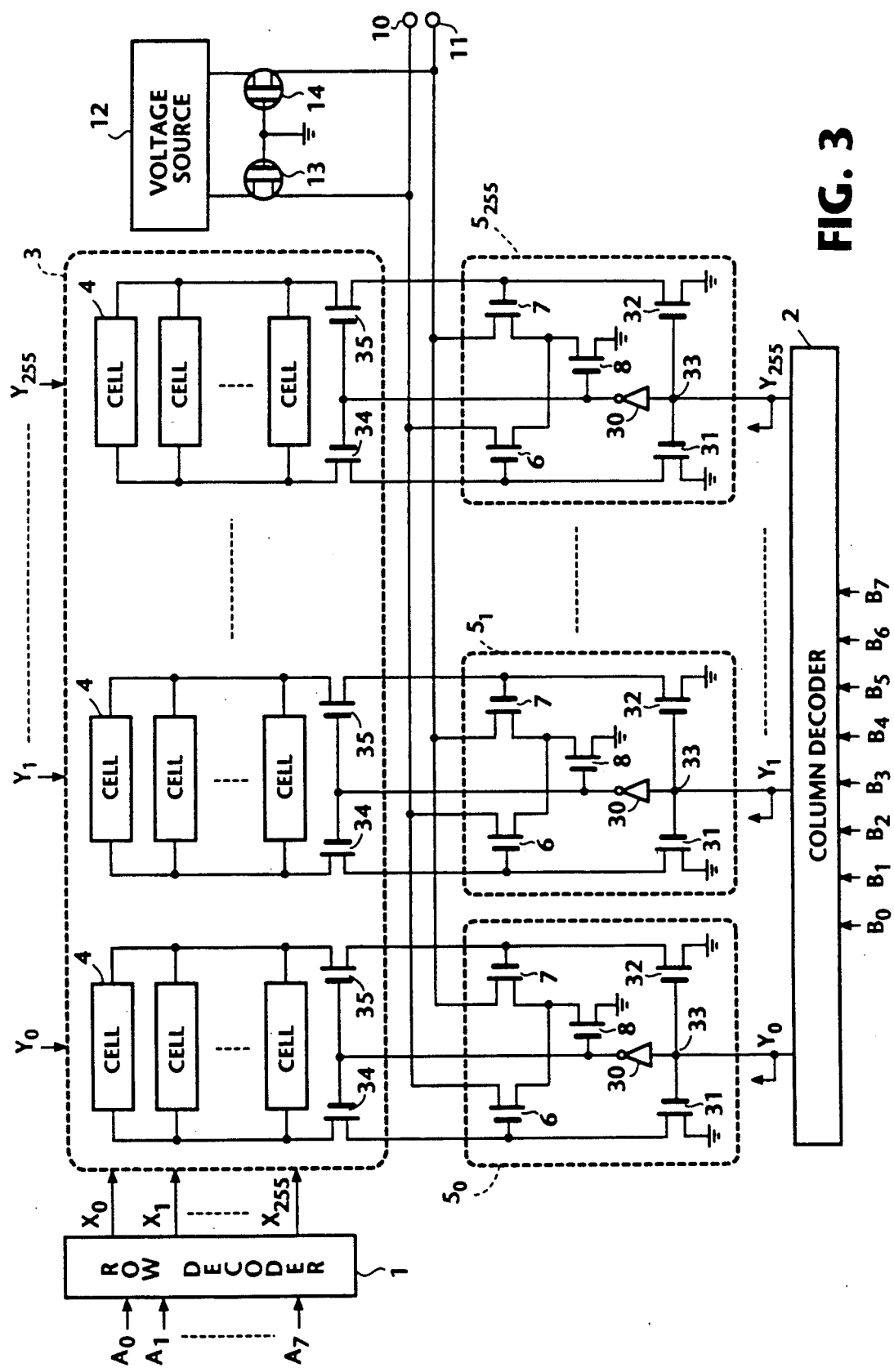
FIG. 3 is a circuit diagram of a sense amplifiers array according to the present invention.

Referring now to FIG. 3, there is shown a memory circuit according to the present invention in which parts corresponding to those in FIG. 1 are marked with the same reference numerals as used in FIG. 1.

Each sense amplifier 5 additionally includes n-type MOS transistors 31 and 32 having their source-drain current paths connected respectively between the gates of transistors 6 and 7 and ground. The gates of transistors 31 and 32 are coupled together to a circuit junction 33 to which the corresponding decoder output terminal Y is connected. Circuit junction 33 is in turn connected by a NOT gate 30 to the gate of switching transistor 8. Each column of memory circuit 3 is provided with a pair of n-type MOS transistors 34 and 35. These transistors have their source-drain current path are connected respectively in the data lines of the column and have their gates coupled together to the output of NOT gate 30 of the associated sense amplifier 5.

In this embodiment, each sense amplifier 5 is said to be selected when a low-level input is supplied from a corresponding column decoder output terminal Y and is said to be nonselected when a high-level input is supplied from that terminal. In a selected amplifier 5, transistors 31 and 32 are turned off, disconnecting ground potential from the gates of transistors 6 and 7 to enable them to be turned on in response to complementary voltages supplied from cells 4 of a corresponding column. Since the output of NOT gate 30 of the selected amplifier is high, transistor 8 is turned on, grounding the source-drain current paths of transistors 6 and 7. The high-level output of NOT gate 30 causes transistors 34 and 35 of the associated column to turn on, allowing differential voltages from a memory cell 4 of the column to be supplied to the associated sense amplifier 5.

In nonselected amplifiers 5, because of the presence of low-level voltages at the outputs of NOT gates 30 of these amplifiers, transistors 34 and 35 of the associated columns of the memory 3 are in the OFF state, isolating their transistors 6 and 7 from the associated data lines. This prevents differential voltages of the columns associated with the nonselected sense amplifiers from being destroyed by short-circuits established by the conducting transistors 31 and 32. Due to a high-level output from associated Y terminals, transistors 31 and 32 of the nonselected amplifiers 5 are in the ON state, grounding the gates of transistors 6 and 7 to discharge energies stored at their gates which have been built up due to the isolation from the associated column. Thus, the undesirable leakage current across output terminals 10 and 11 through nonselected amplifiers can be avoided, while allowing the selected sense amplifier to operate with a high amplification gain without introducing a propagation delay.

Figure 4:
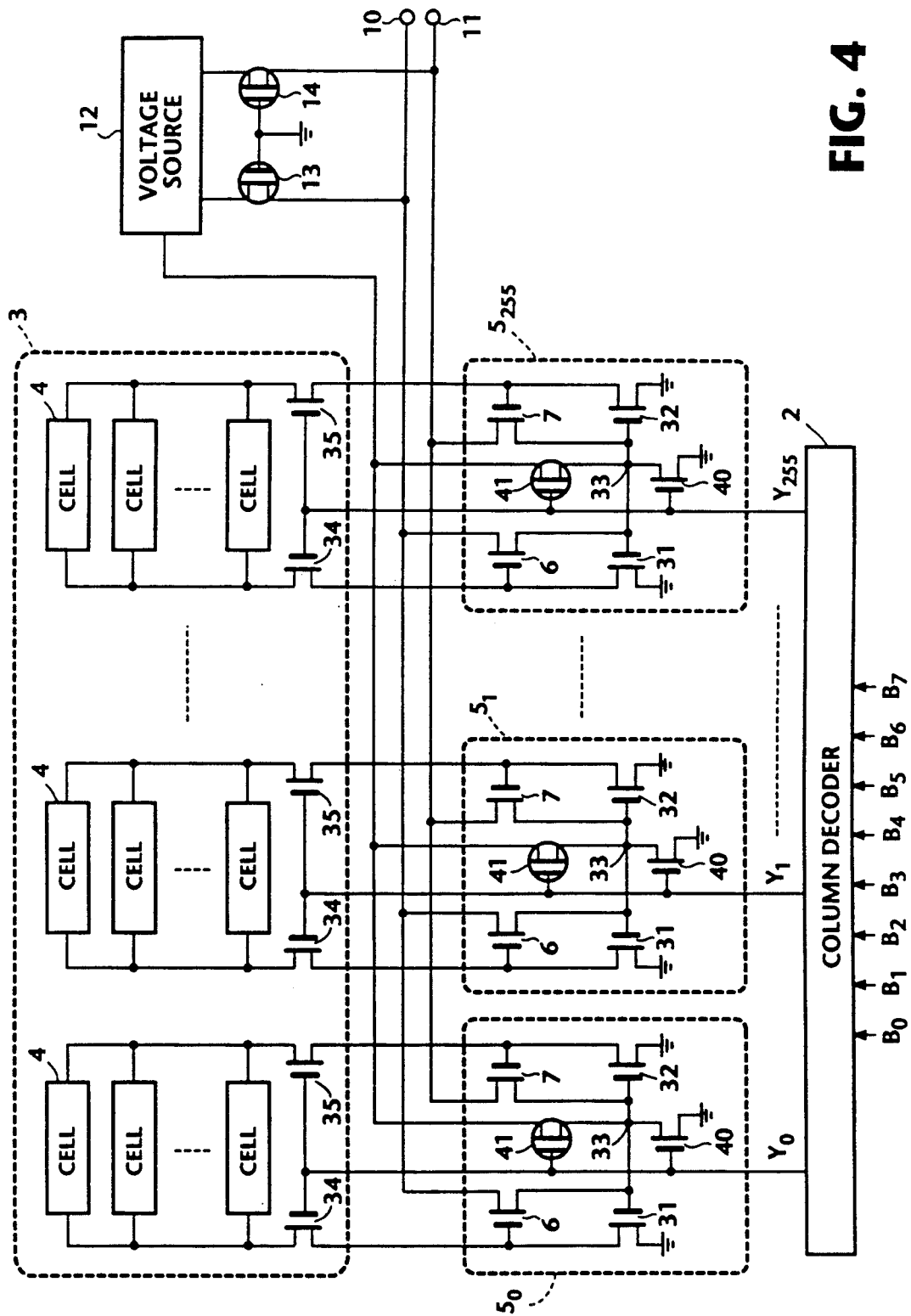
FIG. 4 is a circuit diagram of an alternative embodiment of the invention.

An alternative form of the FIG. 3 embodiment is shown in FIG. 4. In this modification, the switching transistor 8 and NOT gate 30 of each sense amplifier of FIG. 3 are replaced with an n-type MOS transistor 40 and a p-type MOS transistor 41. Transistors 40 and 41 of each amplifier have their gate electrodes coupled together to a corresponding column decoder output terminal Y to which the gates of transistors 34 and 35 of the associated column of memory 3 are also connected. Transistor 40 of each amplifier operates as a switching transistor and has its source-drain current path connected between the ground and circuit junction 33, and transistor 41 has its source-drain current path connected between the junction 33 and the voltage source 12.

In this embodiment, each sense amplifier is said to be selected in response to a high-level input from a corresponding Y output terminal and is said to be nonselected in response to a low-level input from that terminal. In the selected sense amplifier, transistor 40 is turned on, while transistor 41 is in the OFF state, grounding the circuit junction 33 to turn off transistors 31 and 32 to allow transistors 6 and 7 to respond to complementary voltages supplied from the memory circuit 3. In the nonselected amplifiers, transistor 40 is turned off and transistor 41 is turned on, biasing the circuit junction 33 to a high voltage level which causes transistor 31 and 32 to turn on. Thus, the gates of transistors 6 and 7 of the nonselected sense amplifiers are grounded and hence prevented from responding to voltages supplied from the memory 3.

The foregoing description shows only one preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. An amplifier circuit for an array of cells organized into a plurality of cell groups, each of said cell groups having a pair of data lines, and means for selectively applying differential signals from a selected memory cell to the data lines associated with the selected memory cell, comprising:

voltage supply means coupled to first and second output terminals; and a plurality of sense amplifiers associated respectively with said cell groups, each of said sense amplifiers comprising:

a first transistor having a source-drain current path connected at one end thereof to said first output terminal and a gate electrode connected to one of the data lines of the associated cell group;

a second transistor having a source-drain current path connected at one end thereof to said second output terminal and a gate electrode connected to the other data line of the associated cell group;

a third transistor for grounding the other ends of the source-drain current paths of said first and second transistors when said associated cell group is selected during a read cycle to cause said first and second transistors to respond to complementary voltages supplied through the data lines of the associated cell group; and fourth and fifth transistors for grounding the gate electrodes of said first and second transistors when said associated cell group is not selected during said read cycle to prevent said first and second transistors from responding to voltages supplied from one of the memory cells of said associated cell group.

2. An amplifier circuit for a matrix array of memory cells, wherein each of said memory cells stores energy when the row and column of the cell are accessed by a set of a row address signal and a column address signal during a write cycle, and each of the memory cells of each row of the matrix generates complementary voltages when the row is accessed in response to said row address signal during a read cycle, comprising:

voltage supply means coupled to first and second output terminals; and a plurality of sense amplifiers associated respectively with columns of the memory cells, each of said sense amplifiers comprising:

a first transistor having a source-drain current path connected at one end thereof to said first output terminal and a gate electrode connected to first ends of the memory cells of the associated column;

a second transistor having a source-drain current path connected at one end thereof to said second output terminal and a gate electrode connected to second, opposite ends of the memory cells of said associated column;

a third transistor for grounding the other ends of the source-drain current paths of said first and second transistors when said associated column is identified by said column address signal during said read cycle to cause said first and second transistors to respond to complementary voltages supplied from one of the memory cells of the associated column; and fourth and fifth transistors for grounding the gate electrodes of said first and second transistors when said associated column is not identified by said column address signal during said read cycle to prevent said first and second transistors from responding to voltages supplied from one of the memory cells of said associated column.

3. An amplifier circuit as claimed in claim 2, further comprising a plurality of coupling/decoupling means associated respectively with said columns and with said sense amplifiers for respectively establishing paths from the associated columns to the source-drain current paths of said first and second transistors of the associated sense amplifiers when the associated columns are identified by said column address signal and disconnecting said established paths when the associated columns are not identified by said column address signal.

4. A memory comprising;

a row decoder for converting a row address signal into a signal of different logic levels at one of a plurality of row decoder terminals;

a column decoder for converting a column address signal into a signal at different logic levels and causing said signal to appear at one of a plurality of column decoder terminals;

memory cells arranged in a matrix of rows and columns, said rows being associated respectively with said row decoder terminals and said columns being associated respectively with said column decoder terminals, wherein each of said memory cells stores energy when the row and column of the cell are accessed by a signal from the associated row decoder terminal and a signal from the associated column decoder terminal during a write cycle of the memory, and each of the memory cells of each row of the matrix generates complementary voltages when the row is accessed in response to a signal from the associated row decoder terminal during a read cycle of the memory;

voltage supply means coupled to first and second output terminals; and a plurality of sense amplifiers associated respectively with columns of the memory cells and respectively connected to said column decoder terminals, each of said sense amplifiers comprising:

a first transistor having a source-drain current path connected at one end thereof to said first output terminal and a gate electrode connected to first ends of the memory cells of the associated column;

a second transistor having a source-drain current path connected at one end thereof to said second output terminal and a gate electrode connected to second, opposite ends of the memory cells of said associated column;

a third transistor for grounding the other ends of the source-drain current paths of said first and second transistors in response to a signal at a first logic level from the associated column decoder terminal during said read cycle to cause said first and second transistors to respond to complementary voltages supplied from one of the memory cells of the associated column; and fourth and fifth transistors for grounding the gate electrodes of said first and second transistors in response to a signal at a second logic level from the associated column decoder terminal during said read cycle to prevent said first and second transistors from responding to voltages supplied from one of the memory cells of said associated column.

5. A memory as claimed in claim 4, further comprising a plurality of coupling/decoupling means associated respectively with said columns and said sense amplifiers for respectively establishing paths from the associated columns to the source-drain current paths of said first and second transistors of the associated sense amplifiers when the associated columns are each identified by said column address signal and disconnecting said established paths when the associated columns are not identified by said column address signal.

6. An amplifier circuit for a matrix array of memory cells, wherein each of said memory cells stores energy when the row and column of the cell are accessed by a set of a row address signal and a column address signal during a write cycle, and each of the memory cells of each row of the matrix generates complementary voltages when the row is accessed in response to said row address signal during a read cycle, comprising:
   voltage supply means coupled to first and second output terminals;
   a plurality of sense amplifiers associated respectively with columns of the memory cells, each of said sense amplifiers comprising:
   a first transistor having a source-drain current path connected at one end thereof to said first output terminal and a gate electrode connected to first ends of the memory cells of the associated column;
   a second transistor having a source-drain current path connected at one end thereof to said second output terminal and a gate electrode connected to second, opposite ends of the memory cells of said associated column;
   a third transistor for grounding the other ends of the source-drain current paths of said first and second transistors when said associated column is identified by said column address signal during said read cycle to cause said first and second transistors to respond to complementary voltages supplied from one of the memory cells of the associated column; and
   fourth and fifth transistors for grounding the gate electrodes of said first and second transistors when said associated column is not identified by said column address signal during said read cycle to prevent said first and second transistors from responding to voltages supplied from one of the memory cells of said associated column; and
   a column decoder for decoding the column address signal into a logic-0 signal appearing at one of decoder terminals associated respectively with said sense amplifiers, said logic-0 signal indicating that the memory cells of the associated column is accessed during said read cycle and being applied to the gate electrode of the third transistor of the associated sense amplifier through a NOT gate, the gate electrodes of said fourth and fifth transistors being coupled together to said associated decoder terminal for grounding the other ends of the source-drain current paths of said first and second transistors in response to a logic-1 signal at said associated decoder terminal.

7. An amplifier circuit for a matrix array of memory cells, wherein each of said memory cells stores energy when the row and column of the cell are accessed by a set of row address signal and a column address signal during a write cycle, and each of the memory cells of each row of the matrix generates complementary voltages when the row is accessed in response to said row address signal during a read cycle, comprising:
   voltage supply means coupled to first and second output terminals; and
   a plurality of sense amplifiers associated respectively with columns of the memory cells, each of said sense amplifiers comprising:
   a first transistor having a source-drain current path connected at one end thereof to said first output terminal and a gate electrode connected to first ends of the memory cells of the associated column;
   a second transistor having a source-drain current path connected at one end thereof to said second output terminal and a gate electrode connected to second, opposite ends of the memory cells of said associated column;
   a third transistor for grounding the other ends of the source-drain current paths of said first and second transistors when said associated column is identified by said column address signal during said read cycle to cause said first and second transistors to respond to complementary voltages supplied from one of the memory cells of the associated column;
   fourth and fifth transistors for grounding the gate electrodes of said first and second transistors when said associated column is not identified by said column address signal during said read cycle to prevent said first and second transistors from responding to voltages supplied from one of the memory cells of said associated column; and
   a sixth transistor of a conductivity type opposite to the conductivity type of said first, second, third, fourth and fifth transistors, said sixth transistor having a gate electrode responsive to a logic-0 signal applied thereto for biasing the gate electrodes of said fourth and fifth transistors and responsive to a logic-1 signal applied thereto for grounding the gate electrodes of said fourth and fifth transistors; and
   a column decoder for normally applying a logic-0 signal to the gate electrodes of the third and sixth transistors of each of said sense amplifiers and decoding the column address signal into a logic-1 signal appearing at one of decoder terminals associated respectively with said sense amplifiers, said logic-1 signal indicating that the memory cells of the associated column are accessed during said read cycle and being applied to the gate electrodes of said third and sixth transistors of the associated sense amplifier.

8. A memory comprising:
   a row decoder for converting a row address signal into a signal of different logic levels at one of a plurality of row decoder terminals;
   a column decoder for converting a column address signal into a signal at different logic levels and causing said signal to appear at one of a plurality of column decoder terminals;
   memory cells arranged in a matrix of rows and columns, said rows being associated respectively with said row decoder terminals and said columns being associated respectively with said column decoder terminals, wherein each of said memory cells stores energy when the row and column of the cell are accessed by a signal from the associated row decoder terminal and a signal from the associated column decoder terminal during a write cycle of the memory, and each of the memory cells of each row of the matrix generates complementary voltages when the row is accessed in response to a signal from the associated row decoder terminal during a read cycle of the memory;

voltage supply means coupled to first and second output terminals; and a plurality of sense amplifiers associated respectively with columns of the memory cells and respectively connected to said column decoder terminals, each of said sense amplifiers comprising:

a first transistor having a source-drain current path connected at one end thereof to said first output terminal and a gate electrode connected to first ends of the memory cells of the associated column;

a second transistor having a source-drain current path connected at one end thereof to said second output terminal and a gate electrode connected to second, opposite ends of the memory cells of said associated column;

a third transistor for grounding the other ends of the source-drain current paths of said first and second transistors in response to a signal at a first logic level from the associated column decoder terminal during said read cycle to cause said first and second transistors to respond to complementary voltages supplied from one of the memory cell of the associated column; and fourth and fifth transistors for grounding the gate electrodes of said first and second transistors in response to a signal at a second logic level from the associated column decoder terminal during said read cycle to prevent said first and second transistors from responding to voltages supplied from one of the memory cells of said associated column, wherein said signal is at a logic-0 level for indicating that the memory cells of the associated column is accessed during said read cycle, and wherein the gate electrode of said third transistor is connected to receive said logic-0 signal through a NOT gate from the associated column decoder terminal and the gate electrodes of said fourth and fifth transistors are coupled together to said associated column decoder terminal for grounding the other ends of the source-drain current paths of said first and second transistors in response to a signal at a logic-1 level appearing at said associated column decoder terminal.

9. A memory comprising:

a row decoder for converting a row address signal into a signal of different logic levels at one of a plurality of row decoder terminals;

a column decoder for converting a column address signal into a signal at different logic levels and causing said signal to appear at one of a plurality of column decoder terminals;

memory cells arranged in a matrix of rows and columns, said rows being associated respectively with said row decoder terminals and said columns being associated respectively with said column decoder terminals, wherein each of said memory cells stores energy when the row and column of the cell are accessed by a signal from the associated row decoder terminal and a signal from the associated column decoder terminal during a write cycle of the memory, and each of the memory cells of each row of the matrix generates complementary voltages when the row is accessed in response to a signal from the associated row decoder terminal during a read cycle of the memory;

voltage supply means coupled to first and second output terminals; and a plurality of sense amplifiers associated respectively with columns of the memory cells and respectively connected to said column decoder terminals, each of said sense amplifiers comprising:

a first transistor having a source-drain current path connected at one end thereof to said first output terminal and a gate electrode connected to first ends of the memory cells of the associated column;

a second transistor having a source-drain current path connected at one end thereof to said second output terminal and a gate electrode connected to second, opposite ends of the memory cells of said associated column;

a third transistor for grounding the other ends of the source-drain current paths of said first and second transistors in response to a signal at a first logic level from the associated column decoder terminal during said read cycle to cause said first and second transistors to respond to complementary voltages supplied from one of the memory cells of the associated column; and fourth and fifth transistors for grounding the gate electrodes of said first and second transistors in response to a signal at a second logic level from the associated column decoder terminal during said read cycle to prevent said first and second transistors from responding to voltages supplied from one of the memory cells of said associated column; and a sixth transistor of a conductivity type opposite to the conductivity type of said first, second, third, fourth and fifth transistors, said sixth transistor having a gate electrode coupled to an associated one of said column decoder terminals and responsive to a logic-0 signal applied thereto for biasing the gate electrodes of said fourth and fifth transistors and responsive to a logic-1 signal applied thereto for grounding the gate electrodes of said fourth and fifth transistors.

* * * * *